(12) United States Patent
Haulick et al.

(10) Patent No.: US 8,081,776 B2
(45) Date of Patent: Dec. 20, 2011

(54) INDOOR COMMUNICATION SYSTEM FOR A VEHICULAR CABIN

(75) Inventors: Tim Haulick, Blaubeuren (DE); Gerhard Uwe Schmidt, Ulm (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1516 days.

(21) Appl. No.: 11/118,092

(22) Filed: Apr. 29, 2005

(65) Prior Publication Data

US 2005/0265560 A1 Dec. 1, 2005

(30) Foreign Application Priority Data

Apr. 29, 2004 (EP) ..................................... 04010231

(51) Int. Cl.
*H03G 5/00* (2006.01)
(52) U.S. Cl. .............. 381/103; 381/58; 381/59; 381/86; 381/96; 381/83; 381/93; 381/28; 381/104; 381/108
(58) Field of Classification Search .................... 381/98, 381/103, 86, 122, 58–59, 96, 106, 83, 93, 381/28, 104, 108; 333/28; 379/406.06, 406.02, 379/406.08, 406.01, 406.09
See application file for complete search history.

(56) References Cited

U.S. PATENT DOCUMENTS

| | | | |
|---|---|---|---|
| 4,628,530 A * | 12/1986 | Op De Beek et al. | ........ 381/103 |
| 4,739,513 A | 4/1988 | Kunugi et al. | |
| 4,965,833 A | 10/1990 | McGregor et al. | |
| 5,386,478 A | 1/1995 | Plunkett | |
| 5,768,398 A * | 6/1998 | Janse et al. | ..................... 381/103 |
| 5,796,819 A * | 8/1998 | Romesburg | ............. 379/406.09 |
| 6,408,079 B1 * | 6/2002 | Katayama et al. | .............. 381/98 |
| 6,496,581 B1 | 12/2002 | Finn et al. | |
| 6,525,967 B1 | 2/2003 | Briner | |
| 6,665,411 B2 | 12/2003 | Steenhagen | |
| 6,674,865 B1 * | 1/2004 | Venkatesh et al. | ............. 381/107 |
| 6,980,663 B1 * | 12/2005 | Linhard | .......................... 381/86 |
| 7,035,398 B2 | 4/2006 | Matsuo | |
| 7,158,643 B2 * | 1/2007 | Lavoie et al. | .................... 381/58 |
| 7,313,518 B2 * | 12/2007 | Scalart et al. | .................. 704/226 |
| 2004/0114771 A1 * | 6/2004 | Vaughan et al. | ................. 381/86 |
| 2005/0152562 A1 * | 7/2005 | Holmi et al. | ..................... 381/86 |

FOREIGN PATENT DOCUMENTS

| | | |
|---|---|---|
| EP | 0 898 364 A2 | 2/1999 |
| JP | 2001-215130 A | 8/1989 |
| JP | 2009-247787 A | 9/1997 |
| JP | 2000-316199 A | 11/2000 |
| JP | 2002-328682 A | 11/2002 |
| JP | 2007-240933 A | 9/2007 |

* cited by examiner

*Primary Examiner* — Devona Faulk
*Assistant Examiner* — Disler Paul

(57) ABSTRACT

A system automatically determines an equalizing filter characteristic for a communication system within a vehicle. The communication system includes a loudspeaker and a microphone or microphone array. The system transmits a predetermined test signal through the loudspeaker and receive the test signal through the microphone or microphone array. Based on the predetermined test signal and the received test signal, a transfer function is developed. The equalizing filter characteristic is then developed from the transfer function.

33 Claims, 4 Drawing Sheets

INDOOR COMMUNICATION SYSTEM FOR A VEHICULAR CABIN

BACKGROUND OF THE INVENTION

1. Priority Claim

This application claims the benefit of priority from European Application No. 04010231.1, filed Apr. 29, 2004, which is incorporated herein by reference.

2. Technical Field

The invention is directed to an indoor communication system for a vehicular cabin and to a method for automatically determining an equalizing filter characteristic for an in door communication system of a vehicular cabin.

3. Related Art

A noisy environment may make communication between different people inside a vehicle very difficult, particularly if the noise is as loud as the speech. As a particular example, engine and wind noise may create a loud background noise in a vehicular cabin such as the passenger compartment of a car. The loudspeakers of a car radio and a handsfree telephone system may further interfere with communication between the people in the cabin. As a result of these and other noise sources, communication between passengers in the front seat and the back seat or between the driver and the front seat passenger may be very difficult. Communication may be particularly difficult when the vehicle is moving at a high speed.

In one system, one microphone is associated with each passenger seat, including the driver's seat. The microphone is provided near each seat or near the passenger's head. Each microphone records the speech of the respective passenger and the corresponding signals are output via loudspeakers in the car. Usually, the existing loudspeakers in the car may be associated to the different passenger seats. If a loudspeaker is mounted in each door, each of the loudspeakers may be associated with the person sitting next the respective door. This allows the signals from a particular passenger's speech to be output mainly at the loudspeakers corresponding to the other passengers in the cabin. For example, if the driver is speaking, the corresponding speech signal may be output at all of the loudspeakers except for those near the driver.

This type of indoor communication system, however, has the drawback that, undesirable feedback effects may occur, particularly at higher amplification levels. In principle, this drawback might be overcome by setting the stability limit (i.e., the maximal acceptable amplification) at a very conservative, low level. In other words, the maximal amplification limit may be set to such a low value that under almost all circumstances, no undesired feedback effect will occur. However, this has the undesired consequence that an optimal (higher) amplification, which may be necessary in some cases, will not be achieved. This application describes a communication system for the interior of a vehicle cabin that reduces feedback inside the cabin by automatically determining an equalizing filter characteristic for the communication system.

SUMMARY

A system automatically determines an equalizing filter characteristic for an indoor communication system of a vehicular cabin that may include at least one microphone and at least one loudspeaker. One or more loudspeakers (e.g., speakers or loudspeakers) of the indoor communications system transmits a predetermined test signal. One or more microphones receives the test signal to obtain a received test signal. The system may determine a transfer function in the frequency domain based on the test signal and the received test signal. The system also may determine an equalizing filter characteristic based on the transfer function.

A system may also automatically determines an equalizing filter characteristic for an indoor communication system of a vehicular cabin that includes at least one loudspeaker and at least one microphone array connected to a beamformer. One or more loudspeakers of the indoor communications system may transmit a predetermined test signal. One or more microphone arrays may receive the test signal, which may be beamformed to obtain a received test signal. The system may determine a transfer function in the frequency domain based on the predetermined test signal and the received test signal. The system also may determine an equalizing filter characteristic based on the transfer function.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
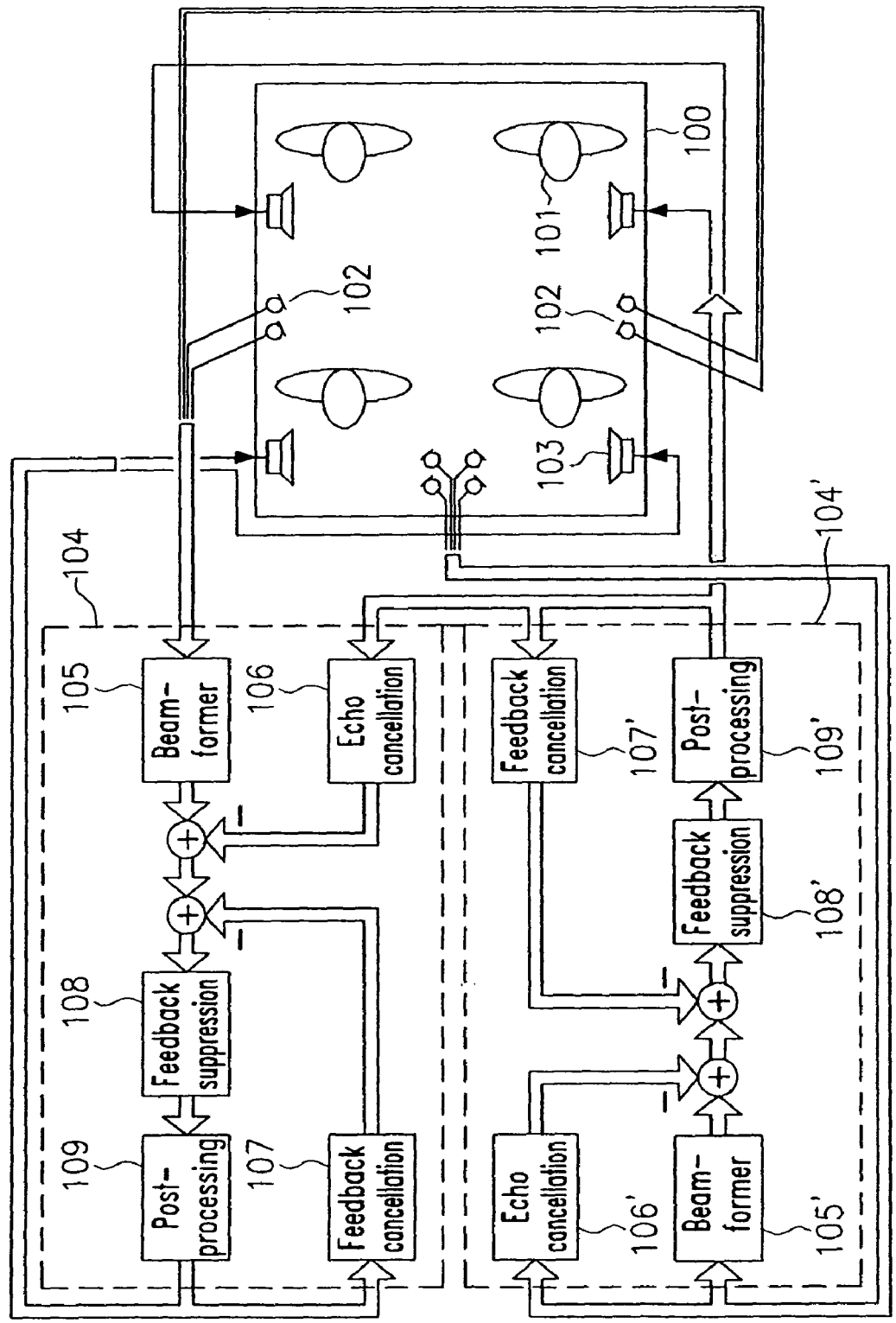
FIG. 1 is a schematic of an indoor communication system for a vehicular cabin.

A system automatically determines an equalizing filter characteristic for a communication system within a vehicular cabin, such as a passenger compartment. The system may include a microphone and a loudspeaker (e.g., speaker or loudspeaker). The system may transmit a predetermined test signal through the loudspeaker. The microphone may receive the test signal to obtain a received test signal. The system determines a transfer function in the frequency domain based on the test signal and the received test signal. Based on the transfer function, the system determined the equalizing filter characteristic.

Alternatively, a microphone array may be used in place of a microphone. A beamformer may be used to beamform signals from the microphone array. In this case, the system may transmit a predetermined test signal through the loudspeaker. The microphone array may then receive the test signal and the beamformer may beamform the signals received by the microphone array to obtain a received test signal. The system determines a transfer function in the frequency domain based on the test signal and the received test signal. Based on the transfer function, the system determined the equalizing filter characteristic.

The term "microphone" (if not explicitly used in the context of microphone arrays) may be used to denote a single microphone or, in other words, a microphone not being part of a microphone array. A loudspeaker may comprise several components such as a high-frequency and a low-frequency unit.

A transfer function is a function characterizing the transmission properties of a trans-mission path. These transmission properties may result from the geometry of the room where the test signal is transmitted from one or several loudspeakers to one or several microphones and/or microphone arrays and possible objects located therein. Furthermore, the transmission properties may also be influenced by electronic components along the signal path, e.g., between the signal generator and the loudspeaker. The received signal is a function, namely the transfer function, of the original test signal. The test signal may be a signal generated by a signal generator.

A beamformer processes signals emanating from a microphone array to obtain a combined signal. A delay-and-sum beamformer may include delay compensation and summing of the signals. Beamforming allows providing a specific directivity pattern for a microphone array.

Thus, a test signal may be used to determine the transmission properties of a signal path as a function in the frequency domain. Based on these transmission properties, an equalizing filter characteristic may be determined. Hence, in contrast to some indoor communication systems, one method allows for the detection of possible feedback frequencies via the transfer function that may be used for an appropriate modification of a signal to be output in order to reduce the occurrence of feedback effects.

The indoor communication system may comprise one or several (single) microphones and/or one or several microphone arrays. Such a microphone or microphone array may be associated to a potential speaker (passenger) and be mounted at appropriate positions. Furthermore, the indoor communication system may also include one or several loudspeakers associated with a microphone or microphone array and the corresponding speaker position.

In particular, the test signal may be transmitted by one loudspeaker. In this way, in particular, for each loudspeaker/microphone pair or each loudspeaker/microphone array pair, a transfer function may be obtained and a corresponding equalizing filter characteristic may be determined such that for each pair, an appropriate equalizing filter is provided. In step (a), the test signal may be received simultaneously by each microphone or microphone array. This enables determination in parallel of an equalizing filter characteristic for each of the microphones or microphone arrays with respect to a given loudspeaker.

Transmission of the test signal also may include transmitting binary white noise or colored noise, such as pink noise. In white noise, all frequencies (in the present context, usually, only frequencies within the range of human hearing are considered) are present and uniformly distributed. This enables a comparison of original test signal and received test signal in a very simple way. A more pleasing sound for people being present in the vehicular cabin may be obtained using colored noise, such as pink noise. Pink noise may be obtained by filtering white noise to reduce the volume at each octave.

Determining the transfer function may include processing the predetermined test signal and the received test signal in the time domain, in particular, using an adaptive filter or using an estimation method based on a periodogram, an autocorrelation function or cross-correlation function. Processing in the time domain may be particularly useful when using broadband test signals. An NLMS (normalized least means squared) algorithm (as described, e.g., in S. Haykin, B. Widrow, *Least-Mean-Square Adaptive Filtering*, John Wiley and Sons, 2003) may be used. After processing in the time domain, the impulse response may be transformed into the frequency domain so as to obtain the transfer function. As an alternative to using broadband test signals, band pass noise with a variable center frequency may be transmitting as the predetermined test signal. In this case, however, all frequency ranges may be activated.

When transmitting band pass noise, the system may determine the square root of the quotient of the short time power spectrum of the received test signal and the short time power spectrum of the test signal for each band pass noise. The transfer function also may be obtained in this way.

In the above-described methods, determining the equalizing filter characteristic may include determining an extremum, in particular, a maximum, of the magnitude of the transfer function. A frequency for which the transfer function has a (global or local) maximum may be considered as a possible feedback frequency. Step (d) also may include determining a local extremum for which the magnitude of the transfer function differs not more than a predetermined amount from the magnitude of the transfer function at a global extremum. Particularly in the case of local maxima, other frequencies (in addition to the global maximum) also may be considered as possible feedback frequencies.

Determining the equalizing filter characteristic also may include providing an attenuation of a predetermined frequency band of a signal being centered at a determined maximum and/or providing an amplification of a predetermined frequency band being centered at a determined minimum. This yields a particularly advantageous equalizing. Due to such an attenuation of a loudspeaker output signal, the (broadband) stability limit may be improved by the value corresponding to the applied attenuation. Particularly if a small attenuation bandwidth is chosen, the difference in acoustic impression of an audio signal in the vehicular cabin may be negligible.

The attenuating step may be performed using a nonlinear phase filter. This has the advantage that inserting small delay time differences when reproducing mono signals may improve the subjective quality impression of the signal.

The system also may automatically determine a maximum amplification value of the indoor communication system. This may include automatically determining an equalizing filter characteristic using the above-described methods for a predetermined loudspeaker, and automatically determining the maximum amplification as $$\text{Gain}_{max} = 1/\max\{|H(e^{j\Omega})G(e^{j\Omega})|\},$$

where $H(e^{j\Omega})$ represents the transfer function and $G(e^{j\Omega})$ represents the frequency response of the equalizing filter.

Determining this maximum amplification or gain allows increasing the maximum amplification as set by the manufacturer, for example. Furthermore, a computer program may be configured on one or more computer readable media to include computer-executable instructions for performing the above-described methods.

In addition, the indoor communication system may include a signal generator configured to generate a predetermined test signal, at least one loudspeaker connected to the signal generator for transmitting the predetermined test signal, and at least one microphone for receiving the transmitted test signal to provide a received test signal. The indoor communication system also may include a signal processor connected to the signal generator and to the microphone(s). The signal processor may be configured to automatically determine a transfer function in the frequency domain based on the test signal and the received signal and to automatically determine an equalizing filter characteristic based on the transfer function.

Alternatively, as noted above, one or more microphone arrays may be used in place of a microphone. The indoor communication system also may include a beamformer for each microphone array. The beamformer(s) may be configured to beamform the signals emanating from the microphone array(s) to provide a received test signal.

These indoor communication systems may enable the use of components that often are already present in a vehicular cabin, such as loudspeakers and microphones or microphone arrays, for example, for use in a handsfree telephone system. In the case of microphone arrays, each microphone array may be connected to the signal processor via a beamformer. In addition, microphones and microphone arrays may both be used in a vehicular cabin. For example, microphone arrays may be provided for the front passengers and single microphones may be provided for the passengers in the back seat.

The indoor communication system may comprise at least two loudspeakers and the signal generator may be connected to the loudspeakers in such a way that the test signal may be separately transmitted by each loudspeaker. This enables the system to perform the previously-described methods separately for each loudspeaker, independent of the other loudspeakers.

The signal generator may be configured to transmit a test signal in the form of binary white noise or colored noise, particularly pink noise. The signal processor of the indoor communication system may be configured to process the test signal and the received test signal in the time domain, for instance, by using an adaptive filter or using an estimation method based on a periodogram, an autocorrelation function or a cross-correlation function. For example, the signal processor may include an NLMS (normalized least means squared) adaptive filter.

As an alternative to a signal generator configured to transmit broadband noise, the signal generator may be configured to transmit band pass noise with variable center frequency. In this case, the signal processor may be configured to determine the square root of the quotient of the short time power spectrum of the received test signal and the short time power spectrum of the test signal for each band pass noise.

The signal processor of the previously-described indoor communication systems may be configured to automatically determine an extremum, such as a maximum of the magnitude of the transfer function. For example, the signal processor may be configured to determine a global extremum of the magnitude of the transfer function. The signal processor also may be configured to determine a local extremum for which the magnitude of the transfer function differs not more than a predetermined amount from the magnitude of the transfer function at a global extremum.

In addition, the signal processor may be configured to automatically attenuate a predetermined frequency band being centered at a determined maximum and/or to amplify a predetermined frequency band being centered at a determined minimum. In such a case, the signal processor may include a nonlinear phase filter for attenuating a predetermined frequency band. The signal processor also may be configured to automatically determine a maximum amplification value as $$\text{Gain}_{max}=1/\max\{|H(e^{j\Omega})G(e^{j\Omega})|\},$$

where $H(e^{j\Omega})$ represents the transfer function and $G(e^{j\Omega})$ represents the frequency response of the equalizing filter.

An overview of a system for indoor communication in a vehicular cabin 100 is shown in FIG. 1. The vehicular cabin 100 may include four passenger seats (not shown) and four passengers 101. A microphone array including two microphones 102 and a loudspeaker 103 may be associated with each passenger. For the front passengers, the microphone arrays may be arranged in the center between the passengers. For example, they may be provided in the car roof. At the rear seats, the microphone arrays may be provided at the left and right side of the passengers, respectively. For example, the microphone arrays for the rear passengers may be provided in the rear car doors. Each loudspeaker may comprise a high-frequency and a low-frequency unit, for example.

The microphone arrays record signals. The signals emanating from the microphone arrays may enter a digital signal processor 104 and 104'. In the example shown in FIG. 1, a first signal processor 104 may be responsible for processing the signals emanating from the microphones associated with the rear passengers and a second digital signal processor 104' may be associated with the signals emanating from the microphones associated with the front passengers. However, this is only a matter of choice, and the signals emanating from the different microphone arrays and also the signals output by the different loudspeakers may be processed in different combinations.

The signals emanating from the microphone arrays may first be processed by an analog/digital converter (not shown), followed by a beamformer 105 and 105'. The beamformers may serve to obtain information on the temporal signal behavior and also spatial information about both desired signal sources (e.g., passenger voices) and undesired signal sources (e.g., noise, car radio loudspeakers). Different types of beamformers (e.g., adaptive beamformers) may be used for the present invention.

In addition, feedback effects also may be avoided during operation of the indoor communication system. For example, echo and feedback components may be subtracted from the signal via adaptive echo cancellation 106 and 106' and feedback cancellation 107 and 107'. Adaptive notch filters 108 and 108' also may detect and attenuate potential feedback frequencies.

Based on the temporal and the spatial information from the beamformer, attenuators may be controlled to limit the loudspeakers through which signals are output. For example, a post-processor 109 and 109' may apply a boundary characteristic. The output signals of the digital signal processor 104 and 104' may be fed, first of all, to corresponding loudspeakers 103. In the example shown in FIG. 1, signals emanating from rear microphone arrays may be output only by the front loudspeakers and vice versa. However, this is not a necessary restriction. The system also may be configured, for example, such that the processed signals may be output by all loudspeakers except the loudspeakers corresponding to location of the the microphone array receiving the input signals. Furthermore, the processed signals also may be fed to feedback cancellation 107 and 107' of the same digital signal processor and also to echo cancellation means 106 and 106' of the other digital signal processor. As an alternative to the example shown in FIG. 1, it is also possible to replace some or all of the microphone arrays with single microphones. For example, directional microphones may be used instead of microphone arrays.

Figure 2:
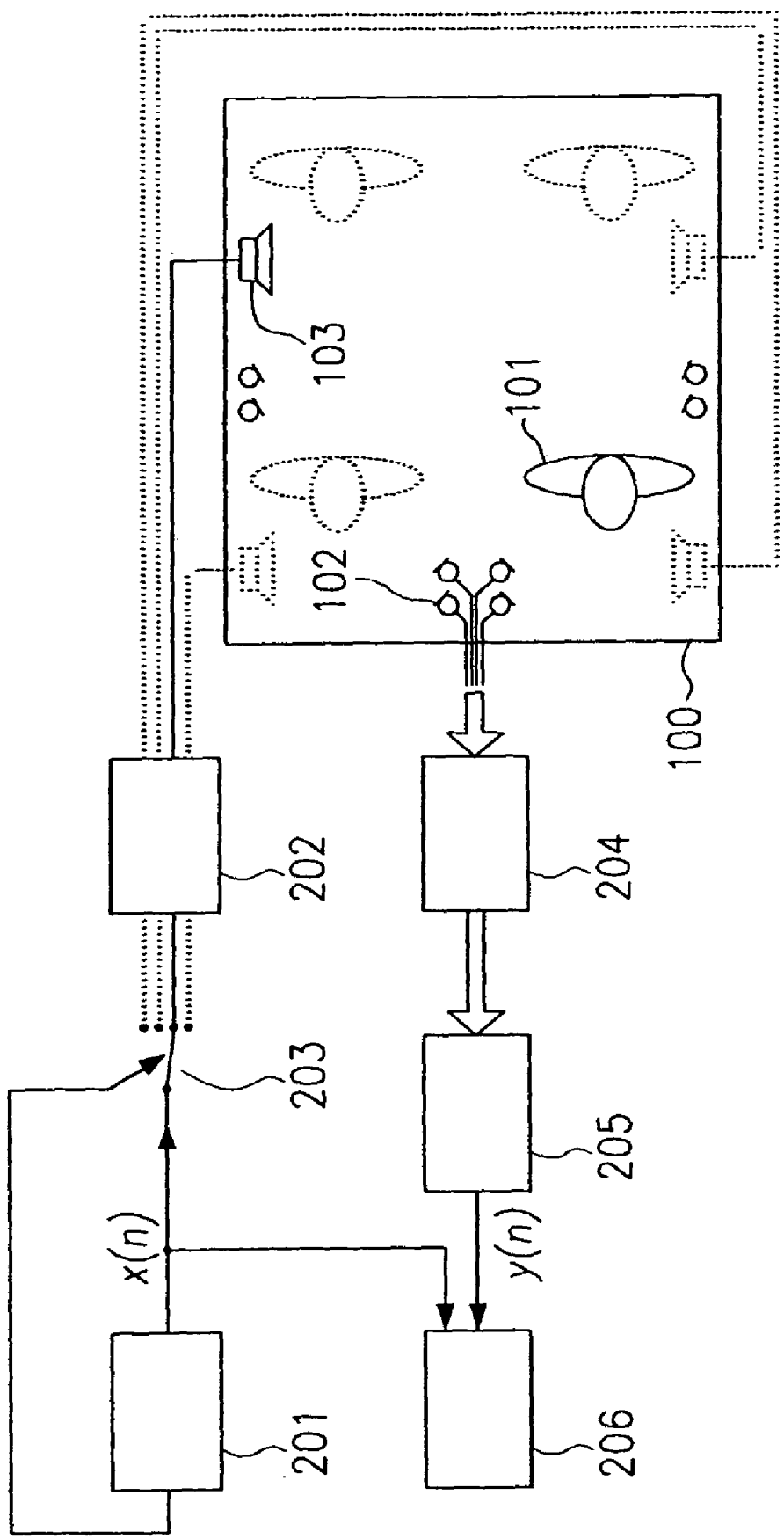
FIG. 2 is a schematic of an indoor communication system configured to determine an equalizing filter characteristic.

An indoor communication system is illustrated in FIG. 2. A vehicular cabin 100 and a passenger 101 (and possible other passengers) are shown. In FIG. 2, the method may be performed for only one active loudspeaker 103; the other loudspeakers, which may not be active, are indicated by dashed lines. The system may include a signal generator 201 for providing a test signal. Such a test signal may be passed through a digital-to-analog converter and an amplifier 202. A switch 203 may be included to address each loudspeaker independently of the other loudspeakers.

The test signal transmitted by loudspeaker 103 may be recorded by the microphone arrays 102. For example, the test signal may be recorded by all microphone arrays simultaneously. Alternatively, it is also possible to successively record the signal by each of the different microphone arrays independently. The signals emanating from the microphone arrays may be processed by an analog-to-digital converter and amplifier 204. After that, a beamformer 205 may process the signal to yield a beamformed signal. This signal may be passed to signal processor 206, which may be connected not only to the microphone array but also to signal generator 201 to receive the test signal.

The signal processor 206 responsible for determining an equalizing filter characteristic may be part of signal processor 104 or 104' shown in FIG. 1. However, it also may be possible to provide this signal processor 206 as a separate unit. This may be useful for later equipping a vehicle that already has an indoor communication system.

Figure 3:
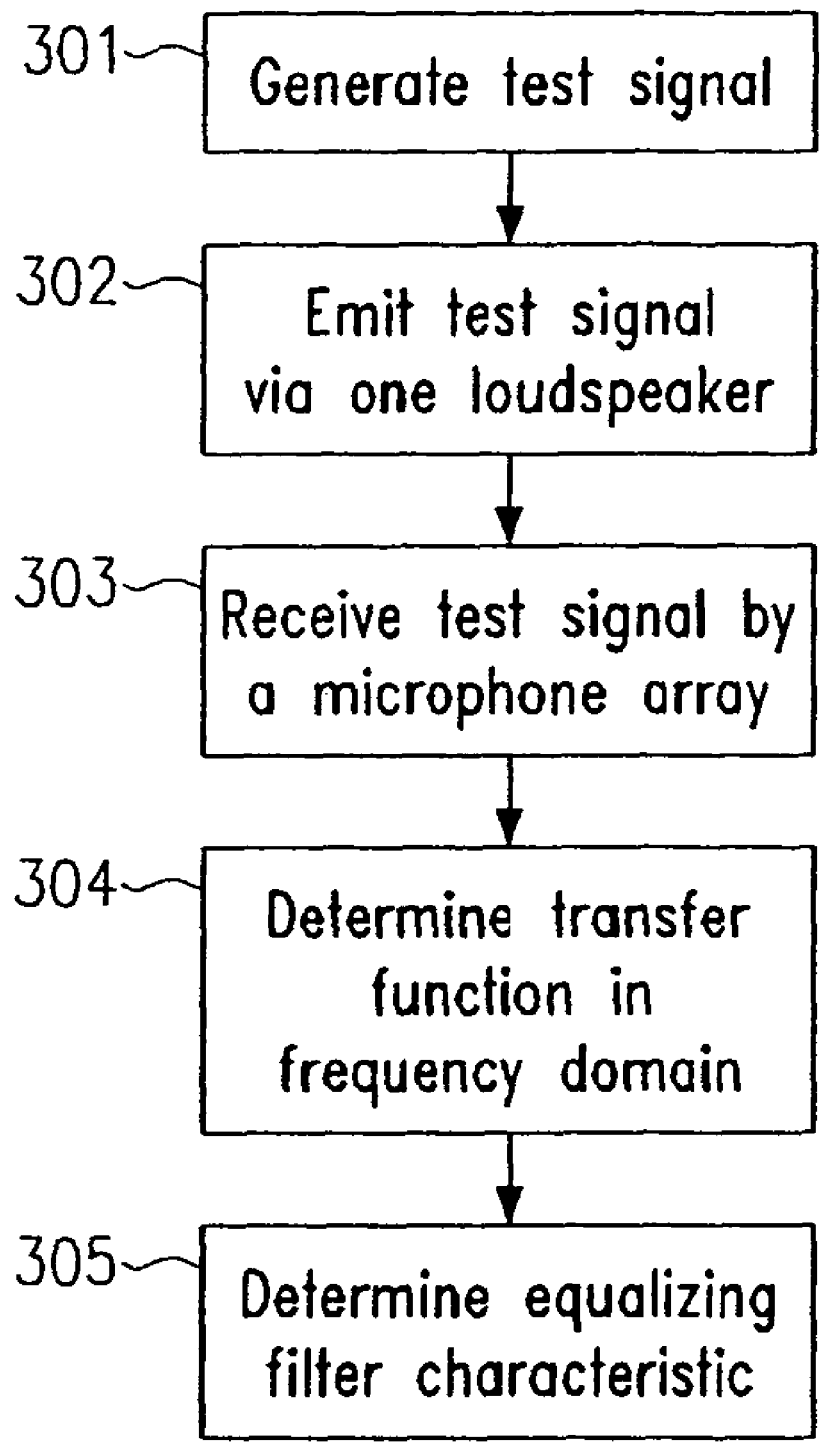
FIG. 3 is a flow diagram for automatically determining an equalizing filter characteristic.

A method for automatically determining an equalizing filter characteristic is illustrated in FIG. 3. A test signal may be generated, as illustrated by block 301. In principle, different test signals are possible. For example, binary white noise may be used as a test signal. This may be an advantageous choice because all frequencies are present and uniformly distributed. Alternatively, colored noise, such as pink noise, also may be used. Colored noise may be an advantageous choice because, passengers may be sitting in the vehicular cabin. Instead of broadband signals, it also may be possible to use narrowband test signals such as band pass noise with variable center frequency. In this case, all frequency ranges may be activated successively.

As illustrated by block 302, the test signal may be transmitted by one of the loudspeakers. The use of one loudspeaker corresponds to the configuration illustrated in FIG. 2. However, two or more loudspeakers also may be used to transmit the test signal in parallel.

Block 303 illustrates the receipt of the test signal by one or more microphone arrays. For example, the test signal may be received by all microphone arrays. The signal from the microphone array may be processed by the beamformer and then provided to a signal processor. The signal processor may automatically determine a transfer function in the frequency domain, as illustrated by block 304. In the case of broadband test signals, the transmission behavior may be determined in the time domain, for example, using an adaptive filter. For example, the normalized least mean square (NLMS) algorithm with small increments may be used. In addition, the impulse response may be transformed to the frequency domain to obtain the transfer function $H(e^{j\Omega})$. Instead of adaptive filters, estimation methods, such as periodograms or autocorrelation or cross-correlation functions, may be used.

If narrowband test signals are adopted, the transfer function may be determined as the square root of the quotient of the short time power spectra $$\sqrt{\sigma_y^2(n)/\sigma_x^2(n)}$$

Both short time power spectra may be determined for each band pass noise so as to obtain sampling points at the center frequencies of the band pass signals.

As illustrated by block 305, an equalizing filter characteristic may be determined such that an equalizing filter for a microphone array/loudspeaker pair is obtained. The equalizing filter may result in a reduced feedback risk for this pair of components. By performing these steps for a specific loudspeaker and simultaneously for all micro-phone arrays, equalizing filters may be obtained for each of these pairs. The steps may then be repeated with another loudspeaker until the method has been performed for all loudspeakers present in the vehicular cabin.

Figure 4:
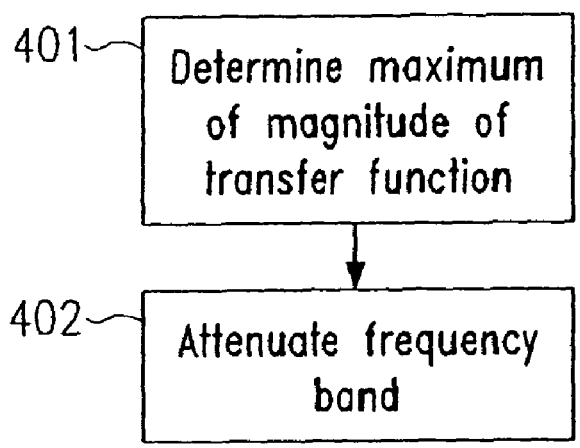
FIG. 4 is a flow diagram for attenuating a possible feedback frequency.

FIG. 4 illustrates an example of how to determine (at least parts of) the equalizing filter characteristic illustrated by block 305 of FIG. 3. This may be particularly useful when determining the transfer function using adaptive filters as described above. According to this example, one or several maxima of the transfer function $H(e^{j\Omega})$ may be determined, as illustrated by block 401. For example, a maximum frequency $\Omega_{max}$ $$|H(e^{j\Omega})|\underset{\Omega=\Omega_{max}}{\rightarrow} \max$$

may be determined. The number of frequencies determined in this way may depend on the design principle of the equalization filters. For example, 3-5 frequency values ma be determined if these frequencies are sufficiently separated. If this is not the case, it may be possible to determine more than 5 frequency values.

When using narrowband test noise, the frequencies $\Omega_{max}$ or the band pass ranges with the largest quotient may be determined based on the short time power spectra described above. Thus, possible feedback frequencies for a particular loudspeaker/microphone may be determined.

After having determined a possible feedback frequency, as illustrated by block 401, an attenuation may be provided for one or several frequency bands (depending on the number of possible feedback frequencies), as illustrated by block 402. For example, attenuations may be applied in small bands around the determined frequencies $\Omega_{max}$. In particular, attenuations of some dB may be inserted for the desired frequency bands without attenuating the remaining frequency ranges.

A similar process may be used to amplify minima of the transfer function. In such a case, minimum frequencies may be determined and corresponding amplifications may be applied. The amplification of these desired frequency bands may cause the output signal to seem louder to the listener.

Because the transfer functions of different loudspeaker/microphone array pairs may be different, an additional positive effect may be achieved when using nonlinear phase equalizing filters. For example, by inserting small delay differences when playing mono signals via several loudspeakers, the subject quality impression may be increased (see e.g. M. Schroeder, *Computer Speech—Recognition, Compression, Synthesis*, Springer 1999). This effect may be considered when determining the equalization filters.

Figure 5:
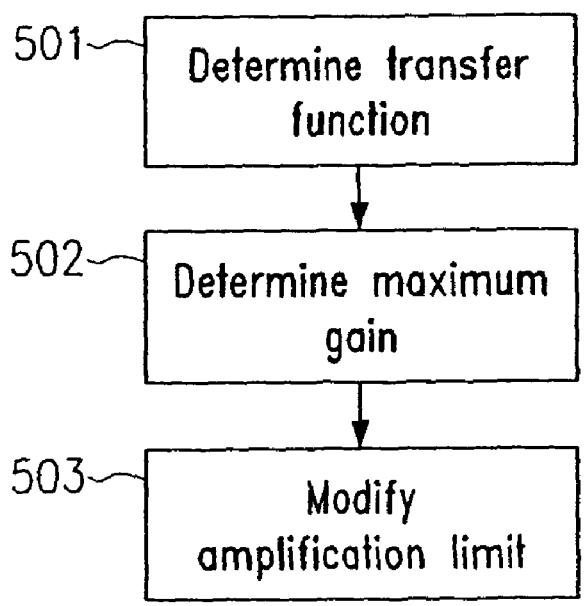
FIG. 5 is a flow diagram for modifying a maximum amplification.

FIG. 5 illustrates a modification of the maximum amplification (stability limit) of an indoor communication system. Block 501 illustrates a determination of the transfer function, as described above. The maximum gain (amplification) may be determined, as illustrated by block 502, using $$\text{Gain}_{max}=1/\max\{|H(e^{j\Omega})G(e^{j\Omega})|\},$$

where $H(e^{j\Omega})$ represents the transfer function and $G(e^{j\Omega})$ represents the frequency response of the corresponding equalizing filter. This reciprocal value may be determined for each loudspeaker/microphone array pair.

Given this stability limit, the maximum amplification may be modified accordingly, as illustrated by block 503. This may enable operation of the indoor communication system near the stability limit, which may be particularly useful in the presence of large ambient noise. Based on a determination of the transfer function, this stability limit may be individually determined for each vehicle (and each loudspeaker and microphone or microphone array mounted therein). In addition, the stability limit may be used to correct (increase) the maximum amplification as originally set by the manufacturer. This may further improve the quality of indoor communication systems.

Because equalizing filters are used to reproduce signals of the indoor communication system, the equalizing filters may be provided before the mixing matrices of the audio amplifiers. In this case, the equalizing filters may not modify the sound of other audio sources of the vehicle.

In addition, the previously described methods also may be used to improve the audio output of other audio components such as handsfree systems or speech recognition. For example, upon detecting that a center loudspeaker located near the front microphones creates larger microphone signals than the other loudspeakers, the output power for the center loudspeaker may be reduced accordingly. Overdriving the microphones due to the audio output may be avoided in this way, which may increase the performance of a handsfree system or a speech recognition system.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method of automatically determining a maximum amplification value of an indoor communication system of a vehicular cabin, the method comprising:

beamforming a predetermined test signal received at a microphone to obtain a received test signal;

determining via a processor an equalizing filter characteristic for a predetermined loudspeaker for use with an equalizing filter based on the predetermined test signal and the received test signal; and determining via the processor the maximum amplification value as $$\text{Gain}_{max} = 1/\max\{|H(e^{i\Omega})G(e^{i\Omega})|\},$$

where $H(e^{i\Omega})$ represents a transfer function and $G(e^{i\Omega})$ represents a frequency response of the equalizing filter.

2. A method of optimizing communication in a vehicular cabin using an indoor communication system having at least one loudspeaker and at least one microphone array, the method comprising:

transmitting a predetermined test signal by a loudspeaker of the indoor communication system;

receiving the test signal by a microphone array of the indoor communication system and generating microphone array output signals;

beam forming the microphone array output signals to obtain a received test signal;

determining a transfer function in the frequency domain based on the predetermined test signal and the received test signal;

determining an equalizing filter characteristic of an equalizing filter based on the transfer function; and determining a maximum amplification value as $$\text{Gain}_{max} = 1/\max\{|H(e^{i\Omega})G(e^{i\Omega})|\},$$

where $H(e^{i\Omega})$ represents a transfer function and $G(e^{i\Omega})$ represents a frequency response of the equalizing filter.

3. A method according to claim 2, where the predetermined test signal further comprises a noise signal.

4. A method according to claim 2, where determining the transfer function further comprises determining the square root of a quotient of a short time power spectrum of the received test signal and a short time power spectrum of the predetermined test signal.

5. A method according to claim 2, where determining the equalization filter characteristic further comprises determining a global extremum of the magnitude of the transfer function.

6. A method according to claim 2, where determining the equalization filter characteristic further comprises determining a local extremum for which the magnitude of the transfer function differs by no more than a predetermined amount from the magnitude of the transfer function at a global extremism.

7. A method according to claim 2, where determining the equalization filter characteristic further comprises:

determining a minimum of the magnitude of the transfer function; and providing an amplification of a predetermined frequency band being centered at the determined minimum.

8. A method according to claim 2, where determining the equalization filter characteristic further comprises:

determining a maximum of the magnitude of the transfer function; and providing an attenuation of a predetermined frequency band centered at the determined maximum.

9. An indoor communication system for a vehicular cabin, comprising:

a signal generator configured to generate a predetermined test signal;

at least one loudspeaker connected to the signal generator and configured to transmit the predetermined test signal;

at least one microphone array configured to receive the transmitted test signal and to generate a microphone array output signal;

a beamformer associated with each microphone array and configured to beamform the microphone array output signal and to provide a received test signal; and a signal processor connected to the signal generator and to the at least one microphone array, where the signal processor is configured to determine a transfer function in the frequency domain based on the predetermined test signal and the received test signal, to determine an equalizing filter characteristic based on the transfer function, to configure an equalizing filter, and to automatically determine a maximum amplification as $$\text{Gain}_{max} = 1/\max\{|H(e^{i\Omega})G(e^{i\Omega})|\},$$

where $H(e^{i\Omega})$ represents the transfer function and $G(e^{i\Omega})$ represents a frequency response of the equalizing filter.

10. An indoor communication system according to claim 9, where the predetermined test signal further comprises a noise signal.

11. An indoor communication system according to claim 9, further comprising at least two loudspeakers, wherein the signal generator is connected to the at least two loudspeakers and the signal generator is further configured to provide the predetermined test signal separately to each of the at least two loudspeaker speakers.

12. An indoor communication system according to claim 9, where the signal processor is further configured to determine a square root of a quotient of a short time power spectrum of the received test signal and a short time power spectrum of the predetermined test signal.

13. An indoor communication system according to claim 9, where the signal processor is further configured to determine a global extremum of the magnitude of the transfer function.

14. An indoor communication system according to claim 9, where the signal processor is further configured to determine a local extremum for which the magnitude of the transfer function differs by no more than a predetermined amount from the magnitude of the transfer function at a global extremum.

15. An indoor communication system according to claim 9, where the signal processor is further configured to determine a minimum of the magnitude of the transfer function and to provide an amplification of a predetermined frequency band being centered at the determined minimum.

16. An indoor communication system according to claim 9, where the signal processor is further configured to determine a maximum of the magnitude of the transfer function and to provide an attenuation of a predetermined frequency band centered at a determined maximum.

17. An indoor communication system according to claim 9, where the signal processor is further configured to provide the attenuation using a nonlinear phase filter.

18. A method of method of optimizing communication in a vehicular cabin using an indoor communication system having at least two loudspeakers and at least two microphones, the method comprising:
   transmitting a first predetermined test signal by a first loudspeaker of the indoor communication system;
   receiving the first test signal by a first microphone of the indoor communication system to obtain a first received test signal;
   determining a first transfer function in the frequency domain based on the first predetermined test signal and the first received test signal;
   determining a first equalizing filter characteristic for a first equalizing filter based on the first transfer function;
   determining a first maximum amplification value as $Gain_{1,max}=1/\max\{|H(e^{i\Omega})G_1(e^{i\Omega})|\}$, where $H_1(e^{i\Omega})$ represents the first transfer function and $G_1(e^{i\Omega})$ represents a frequency response of the first equalizing filter;
   transmitting a second predetermined test signal by a second loudspeaker of the indoor communication, system;
   receiving the second test signal by a second microphone of the indoor communication system to obtain a second received test signal;
   determining a second transfer function in the frequency domain based on the second predetermined test signal and the second received test signal; and
   determining a second equalizing filter characteristic for a second equalizing filter based on the second transfer function; and
   determining a second maximum amplification value as $Gain_{2,max}=1/\max\{|H_2(e^{i\Omega})G_2(e^{i\Omega})|\}$, where $H_2(e^{i\Omega})$ represents the second transfer, function and $G_2(e^{i\Omega})$ represents a frequency response of the second equalizing filter.

19. A method according to claim 18, where the first test signal is transmitted prior to transmission of the second test signal.

20. A method according to claim 18, where determining the first transfer function further comprises determining the square root of a quotient of a short time power spectrum of the first received test signal and a short time power spectrum of the first predetermined test signal.

21. A method according to claim 18, where determining the first equalization filter characteristic further comprises determining a global extremum of the magnitude of the first transfer function.

22. A method according to claim 18, where determining the first equalization filter characteristic further comprises determining a local extremum for which the magnitude of the first transfer function differs by no more than a predetermined amount from the magnitude of the first transfer function at a global extremum.

23. A method according to claim 18, where determining the first equalization filter characteristic further comprises:
   determining a minimum of the magnitude of the first transfer function; and
   providing an amplification of a predetermined frequency band being centered at the determined minimum.

24. A method according to claim 18, where determining the first equalization filter characteristic further comprises:
   determining a maximum of the magnitude of the first transfer function; and
   providing an attenuation of a predetermined frequency band centered at the determined maximum.

25. An indoor communication, system for a vehicular cabin, comprising: a signal generator configured to generate a first predetermined test signal and a second predetermined test signal;
   a first loudspeaker connected to the signal generator and configured to transmit the first predetermined test signal;
   a second loudspeaker connected to the signal generator and configured to transmit the second predetermined test signal;
   a first microphone configured to receive the first transmitted test signal and configured to provide a first received test signal;
   a second microphone configured to receive the second transmitted test signal and configured to provide a second received test signal; and
   a signal processor connected to the signal generator, the first microphone, and the second microphone, where the signal processor is configured to determine a first transfer function in the frequency domain based on the first predetermined test signal and the first received test signal;
   to determine a first equalizing filter characteristic for a first equalizing filter based on the first transfer function, and where the signal, processor is further configured to determine a second transfer function in the frequency domain based on the second predetermined test signal and the second received test signal and to determine a second equalizing filter characteristic for a second equalizing filter based on the second transfer function,
   to automatically determine a first maximum amplification for the first loudspeaker as $Gain_{1max}=1/\max\{|H_1(e^{i\Omega})G_1(e^{i\Omega})|\}$, where $H_1(e^{i\Omega})$ represents the first transfer function and $G_1(e^{i\Omega})$ represents a frequency response of the first equalizing filter, and
   to automatically determine a second maximum amplification for the second loudspeaker as $Gain_{2max}=1/\max\{|H_2(e^{i\Omega})G_2(e^{i\Omega})|\}$, where $H_2(e^{j\Omega})$ represents the second transfer function and $G_2(e^{j\Omega})$ represents a frequency response of the second equalizing filter.

26. An indoor communication system according to claim 25, where the signal generator is further configured to generate the first predetermined test signal prior to generating the second predetermined test signal.

27. An indoor communication system according to claim 25, where the first predetermined test signal further comprises a noise signal.

28. An indoor communication system according to claim 25, where the signal processor is further configured to determine a square root of a quotient of a short time power spectrum of the first received test signal and a short time power spectrum of the first predetermined test signal.

29. An indoor communication system according to claim 25, where the signal processor is further configured to determine a global extremum of the magnitude of the first transfer function.

30. An indoor communication system according to claim 25, where the signal processor is further configured to determine a local extremum for which the magnitude of the first transfer function differs by no more than a predetermined amount from the magnitude of the first transfer function at a global extremum.

31. An indoor communication system according to claim 25, where the signal processor is further configured to determine a minimum, of the magnitude of the first transfer function and to provide an amplification of a predetermined frequency band being centered at the determined minimum.

32. An indoor communication system according to claim 25, where the signal processor is further configured to determine a maximum of the magnitude of the first transfer function and to provide an attenuation of a predetermined frequency band centered at a determined maximum.

33. An indoor communication system according to claim 25, where the signal processor is further configured to provide an attenuation of a predetermined frequency band using a nonlinear phase filter.

* * * * *